(12) United States Patent
Lu et al.

(10) Patent No.: US 9,057,947 B2
(45) Date of Patent: Jun. 16, 2015

(54) METHOD FOR ALIGNING SUBSTRATE AND MASK AND METHOD FOR PREPARING SEMICONDUCTOR DEVICE

(71) Applicants: Boe Technology Group Co., Ltd., Beijing (CN); Beijing Boe Display Technology Co., Ltd., Beijing (CN)

(72) Inventors: Guangming Lu, Beijing (CN); Chaoqin Xu, Beijing (CN); Kiyong Kim, Beijing (CN); Ziqing Zhou, Beijing (CN); Xiangnan Yun, Beijing (CN); Liping Luo, Beijing (CN)

(73) Assignees: BOE Technology Group Co., Ltd., Beijing (CN); Beijing BOE Display Technology Co., Ltd., Beijing (CN)

( * ) Notice: Subject to any disclaimer, the term of this patent is extended or adjusted under 35 U.S.C. 154(b) by 13 days.

(21) Appl. No.: 14/073,821

(22) Filed: Nov. 6, 2013

(65) Prior Publication Data
US 2014/0141535 A1 May 22, 2014

(30) Foreign Application Priority Data
Nov. 16, 2012 (CN) .......................... 2012 1 0465560

(51) Int. Cl.
*G03F 9/00* (2006.01)
*G03F 1/42* (2012.01)

(52) U.S. Cl.
CPC .. *G03F 9/00* (2013.01); *G03F 1/42* (2013.01); *G03F 9/70* (2013.01)

(58) Field of Classification Search
CPC ................ G03F 1/42; G03F 9/00; G03F 9/70
USPC ....................................... 430/22, 30; 257/797
See application file for complete search history.

(56) References Cited

FOREIGN PATENT DOCUMENTS

| CN | 201897692 U | 7/2011 |
|---|---|---|
| CN | 102314073 A | 1/2012 |
| CN | 102722082 A | 10/2012 |
| WO | WO 2006/019166 A1 | 2/2006 |

OTHER PUBLICATIONS

Office Action for corresponding Chinese Patent Application No. 201210465560.5, 5 pages, (Sep. 29, 2013).

*Primary Examiner* — Christopher Young
(74) *Attorney, Agent, or Firm* — Blakely, Sokoloff, Taylor & Zafman LLP

(57) ABSTRACT

The invention relates to the technical field of an alignment method, and discloses a method for aligning substrate and mask, including: firstly forming at least one set of alignment marks on a mask plate; selecting a certain number of large-size substrates as sample substrates; forming a plurality of sets of alignment marks on each sample substrate using the mask plate and the at least one set of alignment marks formed thereon to divide the sample substrate into a plurality of sub-substrate areas; and then performing mask process on the respective sample substrates, accurate alignment for each sub-substrate area can be realized by means of the plurality of sets of alignment marks on the sample substrate, and one sub-substrate area can be accurately aligned by means of at least two sets of alignment marks formed on the sample substrate. In the alignment, positions of the plurality of sets of alignment marks formed on the sample substrate are recorded and stored, and mask process on a non-sample substrate is performed based on parameters relating to the stored positions of the plurality of sets of alignment marks, thus the seaming degree between patterns in the same layer and the coincidence degree between patterns in different layers on the non-sample substrate are guaranteed, so that mass production for large-size substrates with good quality can be realized. The invention also discloses a method for preparing semiconductor device.

19 Claims, 2 Drawing Sheets

METHOD FOR ALIGNING SUBSTRATE AND MASK AND METHOD FOR PREPARING SEMICONDUCTOR DEVICE

FIELD OF THE INVENTION

The invention relates to the technical field of an alignment method, in particular, to a method for aligning substrate and mask, and a method for preparing semiconductor device.

BACKGROUND OF THE INVENTION

Photolithography process is necessary in manufacturing semiconductor devices, for example, it is necessary for manufacturing the array substrates in Thin Film Transistor Liquid Crystal Display (TFT-LCD) and Active Matrix Organic Light-Emitting Diode (AMOLED). The Photolithography process includes cleaning, photoresist coating, hardening, exposing, developing, wet etching or dry etching, stripping etc.

In the exposure process, when the exposure process is performed by the exposure machine, in order to make the coincidence degree between patterns formed on respective layers of semiconductor using different mask plates satisfy requirements, and meanwhile, in order to assure that the seaming degree between respective scans performed on the same layer using the same mask plate satisfies requirements, accurate alignment must be guaranteed.

In order to increase productivity, a plurality of semiconductor devices are generally formed on a large substrate, wherein the plurality of semiconductor devices are formed through the same photolithography process, then the substrate is divided into a plurality of separate semiconductor devices or unit substrates each having at least two semiconductor devices. For a large-size array substrate, as the size of the substrate is larger than that of the mask plate, and pixel areas are located inside the substrate, therefore, the alignment marks generally are not allowed to be directly provided on the pixel areas, but provided on the periphery of the substrate 1, as shown in FIG. 1.

However, if only the alignment marks at the periphery of the substrate are used in the exposure process, then the alignment marks on the mask plate must not coincide with the alignment marks completely due to limitation of the size of the mask plate, thus the alignment accuracy is decreased largely, and in the exposure process, it is difficult to assure that the seaming degree between patterns in the same layer and the coincidence degree between patterns in respective layers of the semiconductor device satisfy requirements, which leads to high defective rate of resultant substrates.

SUMMARY OF THE INVENTION

Technical problem to be solved

The invention provides a method for aligning substrate and mask to solve a problem that it is impossible to achieve accurate alignment for exposure using a mask plate which is smaller than a large-size substrate in a mask process for the substrate.

Technical Solution

In order to solve the above problem, the invention provides a method for aligning substrate and mask, which includes steps:

S1. forming at least one set of alignment marks on a mask plate;

S2. selecting a certain number of substrates as sample substrates, and forming a plurality of sets of alignment marks on each sample substrate using the mask plate and the at least one set of alignment marks formed thereon, respectively, the sample substrate is divided into a plurality of sub-substrate areas by the plurality of sets of alignment marks thereon;

S3. performing alignment for each sub-substrate area by means of the plurality of sets of alignment marks on the sample substrate, and recording and storing positions of the plurality set of alignment marks on the sample substrate in the alignment; and S4. performing mask process on non-sample substrates based on parameters relating to the stored positions of the plurality of set of alignment marks.

In the above method for aligning substrate and mask, preferably, the mask plate is further used for the mask process for non-sample substrates.

In the above method for aligning substrate and mask, preferably, each set of alignment marks are provided in areas in the sample substrate corresponding to the alignment marks formed on the mask plate, and one sub-substrate area is aligned by means of at least two sets of alignment marks on the substrate.

In the above method for aligning substrate and mask, preferably, the sizes of the sample substrates and the non-sample substrates are equal to or larger than the size of the mask plate.

In the above method for aligning substrate and mask, preferably, at least three substrates are selected as the sample substrates.

In the above method for aligning substrate and mask, preferably, the alignment marks on the mask plate have cross shape, diamond shape, square shape or bar shape.

In the above method for aligning substrate and mask, preferably, the at least one set of alignment marks formed on the mask plate are arranged in a line along the longitudinal direction, a line along the horizontal direction or a cross.

The invention provides a method for preparing semiconductor device, which includes photolithography process, the photolithography process uses the foregoing method for aligning substrate and mask.

Advantageous effects

In the method for aligning substrate and mask according to the invention, firstly a plurality of sets of alignment marks are formed on a mask plate; a certain number of large-size substrates are selected as sample substrates; a plurality of sets of alignment marks are formed on each sample substrate using the mask plate, and the sample substrate is divided into a plurality of sub-substrate areas by the plurality of sets of alignment marks; then mask process is performed on the sample substrate, accurate alignment for each sub-substrate area can be realized by means of the plurality of sets of alignment marks on the sample substrate, and one sub-substrate area can be accurately aligned by means of at least two sets of alignment marks formed on the sample substrate. In the alignment, positions of the plurality of sets of alignment marks formed on the sample substrate are recorded and stored, and mask process is performed on non-sample substrates based on parameters relating to the stored positions of the plurality of set of alignment marks formed on the sample substrate, thus the seaming degree between patterns in the same layer and the coincidence degree between patterns in different layers on the non-sample substrate are guaranteed, so that mass production for large-size substrates with good quality can be realized.

Figure 1:
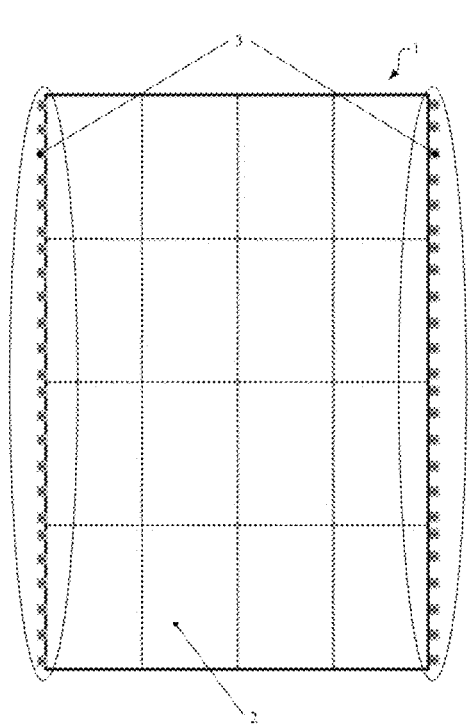
FIG. 1 is a diagram illustrating the distribution of alignment marks on the substrate in the prior art.

In the drawings: 1, substrate; 2, sub-substrate area; 3, alignment mark area; 4, a set of alignment s formed on the mask plate; and 5, a set of alignment marks formed on the sample substrate.

DETAILED DESCRIPTION OF THE EMBODIMENTS

Hereinafter, embodiments will be described with reference to the drawings in detail. Following embodiments are used to illustrate the invention, not to limit the scope of the invention With respect to the mask process for a large-size substrate 1, as the size of the substrate 1 is larger than that of the mask plate used in mask process for the substrate 1, it is necessary to perform mask process many times to form patterns in each layer of semiconductor devices on the large-size substrate 1, as shown in FIG. 1, since the alignment mark areas 3 where the alignment marks of the large-size substrate 1 are sited are positioned in the periphery of the large-size substrate 1, it is difficult to realize accurate alignment in the mask process only by means of these alignment marks, especially, it is difficult to realize accurate alignment in the middle part of the large-size substrate 1 in the mask process, thereby good seaming degree between patterns in the same layer and good coincidence degree between patterns in different layers of the semiconductor devices on the substrate 1 cannot be guaranteed.

To illustrate how to realize accurate alignment in the mask process for semiconductor devices on the large-size substrate 1, embodiments of the present invention will be described in detail by exampling manufacturing semiconductor devices in the array substrate, a method for aligning substrate and mask according to the invention includes steps:

S1. forming at least one set of alignment marks on a mask plate.

In manufacturing the substrate 1, patterns in respective layers of semiconductor devices are formed by using a mask plate to perform the mask process. In generally, the mask plate includes patterns in different areas, for example, as shown in FIG. 2, patterns in L area, M area and R area which are longitudinal areas, and patterns in A area, B area and C area which are horizontal areas, therefore, different areas on the substrate 1 are exposed to light through blocking light by means of portions with patterns on the mask plate and transmitting light by means of portions without patterns on the mask plate to form patterns in respective layers of semiconductor devices on the substrate 1.

In the embodiment, in order to reduce cost, preferably, a plurality of alignment marks 4 are formed on a mask plate to be used in the mask process for non-sample substrates (i.e., the mask plate to be finally used for mass production), and a separate mask plate is not needed. Wherein, a set of alignment marks on the mask plate includes at least two alignment marks, each set of alignment marks 4 may be positioned between patterns in adjacent areas on the mask plate, which are used for forming patterns of semiconductor devices, as shown in FIG. 2.

Figure 2:
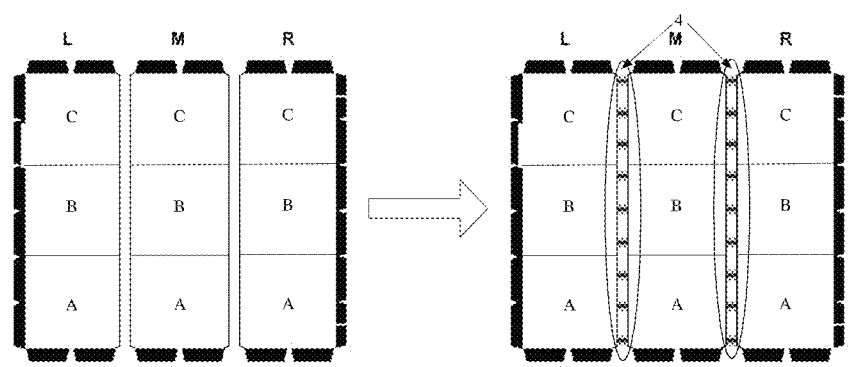
FIG. 2 is a diagram illustrating the procedure of forming alignment marks on a mask plate according to an embodiment of the invention.

It should be noted that each set of alignment marks 4 may have various of shapes, such as cross shape, diamond shape, square shape or the like, rather than bar shape spaced at intervals, as shown in FIG. 2. Also, the plurality of set of alignment marks 4 are not limited to be formed between patterns in longitudinal areas (that is, formed in a line along the longitudinal direction), and may be formed between patterns in horizontal areas (that is, formed in a line along the horizontal direction), or may be formed not only between patterns in longitudinal areas but also between patterns in horizontal area (that is, formed in cross shape).

Figure 3:
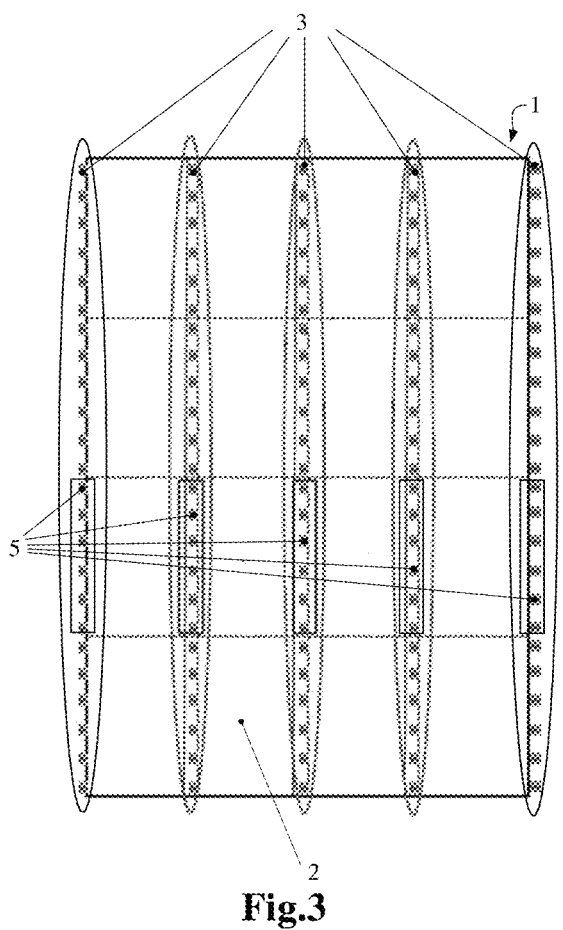
FIG. 3 is a diagram illustrating the distribution of alignment marks on the substrate according to the embodiment of the invention.

S2. selecting a certain number of substrates as sample substrates, and forming a plurality of sets of alignment marks on each sample substrate using the mask plate and the at least one set of alignment marks formed on the mask plate, respectively, the sample substrate is divided into a plurality of sub-substrate areas by the plurality of sets of alignment marks;

Prior to the mask process, a certain number of substrates 1 are selected as sample substrates, and a plurality of sets of alignment marks 5 are formed on each sample substrate using the mask plate obtained in step S1, wherein the sample substrate is divided into a plurality of sub-substrate areas 2 through the plurality of sets of alignment marks 5, as shown in FIG. 3.

Specifically, each sample substrate is exposed to light by means of the above mask plate. In the exposure process, the areas for forming patterns of semiconductor devices on the sample substrate may firstly be blocked using the pattern portions on the mask plate, and the alignment marks on the mask plate are aligned with areas between sub-substrates on the sample substrate, so that areas on the mask plate corresponding to the patterns of semiconductor devices can avoid the alignment mark areas 3 on the sample substrate, and the alignment marks 4 on the mask plate may be aligned with the periphery of the sample substrate. Then at least two sets of alignment marks 5 (five sets of alignment marks 5 are shown in FIG. 3) are formed in the periphery of the sub-substrate areas 2 on the sample substrate and the periphery of the sample substrate by an exposure process, so that the sub-substrate areas 2 may be accurately aligned in the subsequent mask process for forming semiconductor devices, as shown in FIGS. 2 and 3.

It should be appreciated that, FIG. 3 shows a layout wherein a plurality of sets of alignment marks 5 are formed on the sample substrate by using the alignment marks 4 in FIG. 2, which is just illustrative, and the invention is not limit thereto. In fact, according to the patterns of semiconductor devices to be formed, the layout of alignment marks 5 to be formed on the sample substrate may exhibit various irregular shapes.

It is easy to be understood that, the more the selected sample substrates are, the higher the alignment accuracy is, and accordingly the higher the alignment accuracy in the mask process for non-sample substrates is, but it will increase cost for manufacturing resultant substrates. In the present embodiment, at least three substrates 1 may be selected as sample substrates, preferably, three substrates 1 are selected as sample substrates, thus enough high alignment accuracy may be guaranteed and the manufacturing cost may be saved.

S3. performing mask process on the sample substrates, and aligning each sub-substrate area by means of the plurality of sets of alignment marks on the sample substrates, and recording and storing positions of the plurality sets of alignment marks in the alignment by the exposure machine.

When mask process is performed on respective layers of semiconductor devices on the sample substrates, taking Nikon FX-86S exposure machine as an example, firstly, C-EGA exposure mode is selected, the number of sample substrates are set as three, and then mask process is performed on the resultant three sample substrates obtained in the step S2 successively. Wherein, the exposure mode for the three sample substrates is EGA, and the accurate alignment for each sub-substrate area 2 in the sample substrate may be realized through the at least two sets of alignment marks 5 in the periphery of the sub-substrate area 2, so that the seaming degree between patterns in the same layer and the coincidence degree between patterns in different layers of semiconductor devices in the sample substrates are guaranteed.

In the embodiment, the accurate alignment for each sub-substrate area 2 may be realized through a plurality of sets of alignment marks 5, and one sub-substrate area 2 may be accurately aligned through at least two sets of alignment marks 5. Meanwhile, as the exposure machine has functions of data-recording, storing and automatic alignment, in the exposure process for all sample substrates, the exposure machine may record and store the parameters of positions of each set of alignment marks 5.

S4. performing mask process on non-sample substrates based on the stored parameters of positions of the plurality of set of alignment marks 5 by the exposure machine.

The exposure machine may automatically identify the positions of each set of alignment marks 5 through the recorded and stored parameters of positions of each set of alignment marks 5 without forming alignment marks for corresponding positions on non-sample substrates. Then, the exposure machine may perform exposure process on a large number of non-sample substrates in C-EGA mode, and the seaming degree between patterns in the same layer and the coincidence degree between patterns in different layers of semiconductor devices in the non-sample substrates are guaranteed.

It is easy for a person skilled in the art to know that accurate alignment in the mask process for large-size substrates 1 in the embodiment of the invention may be realized as long as the exposure machine has the above two exposure modes, i.e. C-EGA exposure mode and EGA exposure mode, however, the exposure machine is not limited to Nikon FX-86S.

It can be seen from the above embodiments that, in the method for aligning substrate and mask according to the invention, firstly at least one set of alignment marks are formed on a mask plate; then a certain number of substrates are selected as sample substrates, and a plurality of sets of alignment marks are formed on each sample substrate using the mask plate, the sample substrate is divided into a plurality of sub-substrate areas by the plurality of sets of alignment marks; then mask process is performed on the sample substrate, accurate alignment for each sub-substrate area can be realized by means of the plurality of sets of alignment marks on the sample substrate, and one sub-substrate area can be accurately aligned by means of at least two sets of alignment marks; and positions of each set of alignment marks formed on the sample substrate are recorded and stored in the alignment, and mask process is performed on non-sample substrates based on parameters of the stored positions of the plurality of set of alignment marks, thus the seaming degree between patterns in the same layer and the coincidence degree between patterns in different layers on the non-sample substrates are guaranteed, so that mass production for large-size substrates with good quality can be realized.

In addition, the invention also provides a method for preparing semiconductor devices, the method includes photolithography process, which uses the method for aligning substrate and mask described above in detail by taking semiconductor devices as an example. Wherein, the semiconductor devices include single-junction transistors, LEDs, and integrated blocks and chips including semiconductor elements, etc.

It should be appreciated that, although the present invention is disclosed by means of preferred embodiments, the above embodiments are not for limiting the protection scope of the present invention. The persons skilled in the art could make many modifications and variants to the present invention without departing from the principle of the present invention. Any modification, equivalent substitution, improvement or the like falling within the sprits and the scopes of the present invention are intended to be included within the scope of protection of the present invention.

What is claimed is:

1. A method for aligning substrate and mask, comprising:
    S1. forming at least one set of alignment marks on a mask plate;
    S2. selecting a certain number of substrates as sample substrates, and forming a plurality of sets of alignment marks on each sample substrate using the mask plate and the at least one set of alignment marks formed thereon, respectively, the sample substrate is divided into a plurality of sub-substrate areas by the plurality of sets of alignment marks;
    S3. performing alignment for each sub-substrate area by means of the plurality of sets of alignment marks on the sample substrate, and recording and storing positions of each set of alignment marks on the sample substrate; and
    S4. performing mask process on non-sample substrates based on parameters relating to the stored positions of the plurality of set of alignment marks.

2. The method for aligning substrate and mask according to claim 1, wherein the mask plate is further used for the mask process on non-sample substrates.

3. The method for aligning substrate and mask according to claim 2, wherein each set of alignment marks formed on the sample substrate are provided in areas of the sample substrate corresponding to the alignment marks formed on the mask plate, and one sub-substrate area is aligned by means of at least two sets of alignment marks formed on the sample substrate.

4. The method for aligning substrate and mask according to claim 1, wherein the sizes of the sample substrates and the non-sample substrates are equal to or larger than the size of the mask plate.

5. The method for aligning substrate and mask according to claim 2, wherein the sizes of the sample substrates and the non-sample substrates are equal to or larger than the size of the mask plate.

6. The method for aligning substrate and mask according to claim 3, wherein the sizes of the sample substrates and the non-sample substrates are equal to or larger than the size of the mask plate.

7. The method for aligning substrate and mask according to claim 1, wherein at least three substrates are selected as the sample substrates.

8. The method for aligning substrate and mask according to claim 2, wherein at least three substrates are selected as the sample substrates.

9. The method for aligning substrate and mask according to claim 3, wherein at least three substrates are selected as the sample substrates.

10. The method for aligning substrate and mask according to claim 1, wherein the at least one set of alignment marks on the mask plate includes at least two alignment marks.

11. The method for aligning substrate and mask according to claim 2, wherein the at least one set of alignment marks on the mask plate includes at least two alignment marks.

12. The method for aligning substrate and mask according to claim 3, wherein the at least one set of alignment marks on the mask plate includes at least two alignment marks.

13. The method for aligning substrate and mask according to claim 1, wherein the alignment marks on the mask plate have cross shape, diamond shape, square shape or bar shape.

14. The method for aligning substrate and mask according to claim 2, wherein the alignment marks on the mask plate have cross shape, diamond shape, square shape or bar shape.

15. The method for aligning substrate and mask according to claim 3, wherein the alignment marks on the mask plate have cross shape, diamond shape, square shape or bar shape.

16. The method for aligning substrate and mask according to claim 1, wherein the at least one set of alignment marks formed on the mask plate are arranged in a line along the longitudinal direction, a line along the horizontal direction or a cross.

17. The method for aligning substrate and mask according to claim 2, wherein the at least one set of alignment marks formed on the mask plate are arranged in a line along the longitudinal direction, a line along the horizontal direction or a cross.

18. The method for aligning substrate and mask according to claim 3, wherein the at least one set of alignment marks formed on the mask plate are arranged in a line along the longitudinal direction, a line along the horizontal direction or a cross.

19. A method for preparing semiconductor device, including photolithography process, wherein the photolithography process uses a method for aligning substrate and mask, comprising:
    S1. forming at least one set of alignment marks on a mask plate;
    S2. selecting a certain number of substrates as sample substrates, and forming a plurality of sets of alignment marks on each sample substrate using the mask plate and the at least one set of alignment marks formed thereon, respectively, the sample substrate is divided into a plurality of sub-substrate areas by the plurality of sets of alignment marks;
    S3. performing alignment for each sub-substrate area by means of the plurality of sets of alignment marks on the sample substrate, and recording and storing positions of each set of alignment marks on the sample substrate; and
    S4. performing mask process on non-sample substrates based on parameters relating to the stored positions of the plurality of set of alignment marks.

\* \* \* \* \*